(12) United States Patent
Prall et al.

(10) Patent No.: US 6,211,007 B1
(45) Date of Patent: *Apr. 3, 2001

(54) PROCESS FOR ENHANCING REFRESH IN DYNAMIC RANDOM ACCESS MEMORY DEVICES

(75) Inventors: Kirk D. Prall; Robert Kerr; Christopher Murphy; D. Mark Durcan, all of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 08/868,058

(22) Filed: Jun. 3, 1997

Related U.S. Application Data

(63) Continuation of application No. 08/399,843, filed on Mar. 7, 1995, now Pat. No. 5,650,349.

(51) Int. Cl.$^7$ .................................................. H01L 21/8242
(52) U.S. Cl. ............................................. 438/253; 438/252
(58) Field of Search .................................. 438/253–286, 438/390–399

(56) References Cited

U.S. PATENT DOCUMENTS

| | | | |
|---|---|---|---|
| 4,512,073 | 4/1985 | Hsy | 29/571 |
| 4,709,467 | 12/1987 | Liu | 437/30 |
| 5,126,916 | 6/1992 | Tseng | 361/313 |
| 5,168,073 | 12/1992 | Gonzalez et al. | 437/47 |
| 5,198,386 | * 3/1993 | Gonzalez . | |
| 5,219,770 | 6/1993 | Shirato et al. | 437/40 |
| 5,227,325 | 7/1993 | Gonzalez | 437/52 |
| 5,234,856 | 8/1993 | Gonzalez | 437/47 |
| 5,240,872 | 8/1993 | Motonami et al. | 437/52 |
| 5,244,826 | 9/1993 | Gonzalez et al. | 437/60 |
| 5,250,832 | 10/1993 | Murai | 257/306 |
| 5,320,974 | 6/1994 | Hori et al. | 437/44 |
| 5,376,566 | 12/1994 | Gonzalez | 437/35 |
| 5,491,104 | * 2/1996 | Lee et al. . | |
| 5,547,885 | 8/1996 | Ogoh | 437/44 |
| 5,650,349 | * 7/1997 | Prall et al. . | |

FOREIGN PATENT DOCUMENTS 60-253274  12/1985  (JP) ................................ 437/40 AS

OTHER PUBLICATIONS

Hurkx et al., A New Recombination Model For Device Simulation Including Tunneling, IEEE TRED vol. 39, No. 2, Feb. 1992, pp. 331–338.

Hurkx, Anomalous Behavior of Surface Leakage Currents in Heavily Doped Gated Diodes, IEEE TRED vol. 40, No. 12, Dec. 1993, pp. 2273–2281.

* cited by examiner

*Primary Examiner*—Jey Tsai
(74) *Attorney, Agent, or Firm*—Ormiston & McKinney, PLLC

(57) ABSTRACT

A process for enhancing refresh in Dynamic Random Access Memories wherein n-type impurities are implanted into the capacitor buried contact after formation of the access transistor components. The process comprises forming a gate insulating layer on a substrate and a transistor gate electrode on the gate insulating layer. First and second transistor source/drain regions are formed on the substrate adjacent to opposite sides of the gate electrodes. N-type impurities, preferably phosphorous atoms, are then implanted into the first source/drain region which will serve as the capacitor buried contact.

8 Claims, 7 Drawing Sheets

PROCESS FOR ENHANCING REFRESH IN DYNAMIC RANDOM ACCESS MEMORY DEVICES

CROSS REFERENCE TO RELATED APPLICATIONS

This is a continuation of application Ser. No. 08/399,843 filed Mar. 7, 1995, U.S. Pat. No. 5,650,349.

FIELD OF THE INVENTION

The invention relates generally to the formation of integrated circuit devices and more particularly to a process for enhancing refresh in Dynamic Random Access Memory devices (DRAMs).

BACKGROUND OF THE INVENTION

Generally, integrated circuits are mass produced by forming many identical circuit patterns on a single silicon wafer, which is thereafter cut into many identical dies or "chips." Integrated circuits, also commonly referred to as semiconductor devices, are made of various materials that may be electrically conductive, electrically nonconductive (insulators) or electrically semiconductive. Silicon, in single crystal or polycrystalline form, is the most commonly used semiconductor material. Both forms of silicon can be made electrically conductive by adding impurities. The introduction of impurities into silicon is commonly referred to as doping. Silicon is typically doped with boron or phosphorus. Boron atoms have one less valence electron than silicon atoms. Therefore, if the silicon is doped with boron, then electron "holes" become the dominant charge carrier and the doped silicon is referred to as p-type silicon. By contrast, phosphorous atoms have one more valence electron than silicon atoms. If the silicon is doped with phosphorous, then electrons become the dominant charge carriers and the doped silicon is referred to as n-type silicon.

Dynamic Random Access Memory devices (DRAMs) comprise arrays of memory cells which contain two basic components—a field effect access transistor and a capacitor. Typically, one side of the transistor is connected to one side of the capacitor. This connection is made between a capacitor bottom electrode and an active area. The areas in a DRAM in which electrical connections are made are generally referred to as active areas. Active areas consist of discrete specially doped regions in the surface of the silicon substrate which serve as electrical contact points (or "buried contacts") as well as source/drain regions for the access transistor. The other side of the transistor and the transistor gate electrode are connected to external contacts—a bit line and a word line, respectively. The other side of the capacitor, the capacitor top electrode, is connected to a reference voltage. Therefore, the formation of the DRAM memory cell comprises the formation of a transistor, a capacitor, a connection between the capacitor and the transistor, and contacts to external circuits.

The many advantages of the formation of smaller circuit components, so that more and more memory cells may be packed onto each chip, are well known. One such advantage of miniaturization of cell components, and the corresponding reduction in memory cell spacing, is that the operating voltages for the DRAM may be decreased. Thus, the cost to operate the device is reduced and its reliability and longevity is enhanced.

Lower operating voltages, however, reduce the time within which each memory cell must be recharged or "refreshed" because less charge is stored on the cell. In DRAMs, the charge on each memory cell must be refreshed periodically because the cell loses or "leaks" charge through the junctions between areas within the silicon substrate having different doping/conductivity characteristics. If the cell is not refreshed before losing a threshold level of charge, then the cell will fail, i.e., lose the bit of information stored therein. And, if a cell fails, then the chip itself is defective and cannot be used. The rate at which charge is leaked through these junctions is an important factor in determining refresh time—the time within which each cell must be recharged. Consequently, it is advantageous to minimize junction leakage to increase refresh time and help compensate for the reductions in refresh time caused by lower operating voltages.

Improvements in refresh are also needed to compensate for increased packing densities and refresh degradation associated with contact misalignment. As more and more cells are packed onto each chip, more time is required to refresh all of the cells on the chip. Further, increased packing densities and corresponding cell miniaturization increases refresh degradation due to trap assisted tunneling, micro zenering and other such refresh loss mechanisms. Since refresh time is controlled by the weakest cell, the average refresh for all cells must be increased to keep the weakest cell above the minimum threshold. There is, thus, a need to enhance refresh to lessen or eliminate the effects of these loss mechanisms and otherwise provide for sufficient time within which all cells on the chip may be refreshed.

Refresh degradation has been observed when contact corridors are misaligned to the active areas. As the size of the memory cell is reduced, the size of the active areas and the corridors available for the capacitor bottom electrodes to reach those active areas are also reduced. Hence, proper alignment of the contacts formed in these corridors becomes more difficult.

One approach to a solution for the problem of obtaining proper contact alignment in narrow contact corridors is the use of an etch stop layer or similar structure to control the corridor etch. One such process of forming contacts is disclosed in U.S. Pat. No. 5,292,677, issued to Dennison on Mar. 8, 1994. Dennison describes a DRAM formation process using an etch stop layer to self-align the contact corridors to the transistor gate and word lines, and corresponding active areas in the substrate. Although this process substantially reduces the risk of contact misalignment and, incidentally, may lessen refresh degradation associated therewith, it does not address refresh problems associated with lower operating voltages or junction leakage.

Another approach to the problem of contact misalignment is illustrated in U.S. Pat. No. 4,512,073, issued to Hsu on Apr. 23, 1985. Hsu describes a process for precluding a metal contact from short circuiting the doped regions to the substrate and for preventing the "spiking" of a metal contact through the doped region. In Hsu, phosphorous is implanted into the previously doped active areas to dope that portion of the substrate that may have been exposed due to misalignment of the contact corridor. As with the Dennison patent, Hsu does not address the problems of refresh degradation in general, and specifically with regard to refresh degradation associated with junction leakage, lower device operating voltages, and misalignment of the contact between the polysilicon capacitor bottom electrode and the transistor source/drain.

There is a need for a DRAM fabrication process that minimizes the problems of refresh degradation associated with miniaturization of cell components and decreased operating voltages, as well as refresh degradation that may result from contact misalignment and junction leakage.

SUMMARY OF THE INVENTION

One object of the invention is to enhance refresh in dynamic access memory devices.

Another object is to alleviate refresh degradation associated with the miniaturization of memory cell components and decreased operating voltages.

Another object is to lessen the adverse effect that contact misalignment and junction leakage may have on refresh.

According to the present invention, these and other objects are achieved by a process of implanting impurities into (i.e., doping) the capacitor buried contact after formation of the access transistor components. The process comprises forming a gate insulating layer on a substrate and a transistor gate electrode on the gate insulating layer. First and second transistor source/drain regions are formed on the substrate adjacent to each side of the gate electrodes. Impurities are then implanted into the first source/drain region which will serve as the capacitor buried contact. If the starting material for the substrate is p-type silicon, then n-type impurities will be implanted into the source/drain region.

In another aspect of the invention, the n-type impurities are phosphorous atoms. The phosphorous ions are implanted at an implantation energy level up to 200 KeV to a depth of approximately 500–2000 angstroms.

In another aspect of the invention, a capacitor first (or bottom) conductor, made of doped polysilicon, is formed to contact the source/drain region after the phosphorous implant. Then, a dielectric layer is formed over the first conductor and a polysilicon second conductor is formed over the dielectric layer. The memory cell may be completed by forming an insulating layer over the structure previously formed, patterning and etching the insulating layer and continuing to etch down to expose portions of the second source/drain region and, thereafter, forming a metal bit line contact contacting the exposed second source/drain region.

The process of the invention, implanting impurities into the capacitor buried contact after formation of the source/drain regions, thus enhances refresh of the memory cell by, it is believed, eliminating one or more defects in the cell.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

The figures are not meant to be actual views of a DRAM memory cell, but merely idealized representations used to depict the structure and process of the invention.

DETAILED DESCRIPTION OF THE PREFERRED EMBODIMENTS

The present invention will be described in terms of Metal Oxide Semiconductor (MOS) technology which is currently the most commonly used integrated circuit technology. MOS generally refers to any integrated circuit in which Metal Oxide Semiconductor Field Effect Transistors (MOSFETs) are used. MOS integrated circuits are typically formed with a lightly doped p-type silicon substrate or a lightly doped n-type silicon substrate. The present invention will be described using lightly doped p-type silicon as the starting material, although the invention may be implemented with other substrate materials. If other substrate materials are used, then there may be corresponding differences in materials and structure of the device as is well known in the art.

The formation of integrated circuits includes photolithographic masking and etching. This process consists of creating a photolithographic mask containing the pattern of the component to be formed, coating the wafer with a light-sensitive material called photoresist, exposing the photoresist coated wafer to ultra-violet light through the mask to soften or harden parts of the photoresist (depending on whether positive or negative photoresist is used), removing the softened parts of the photoresist, etching to remove the materials left unprotected by the photoresist and stripping the remaining photoresist. This photolithographic masking and etching process is referred to herein as "patterning and etching."

Figure 1:
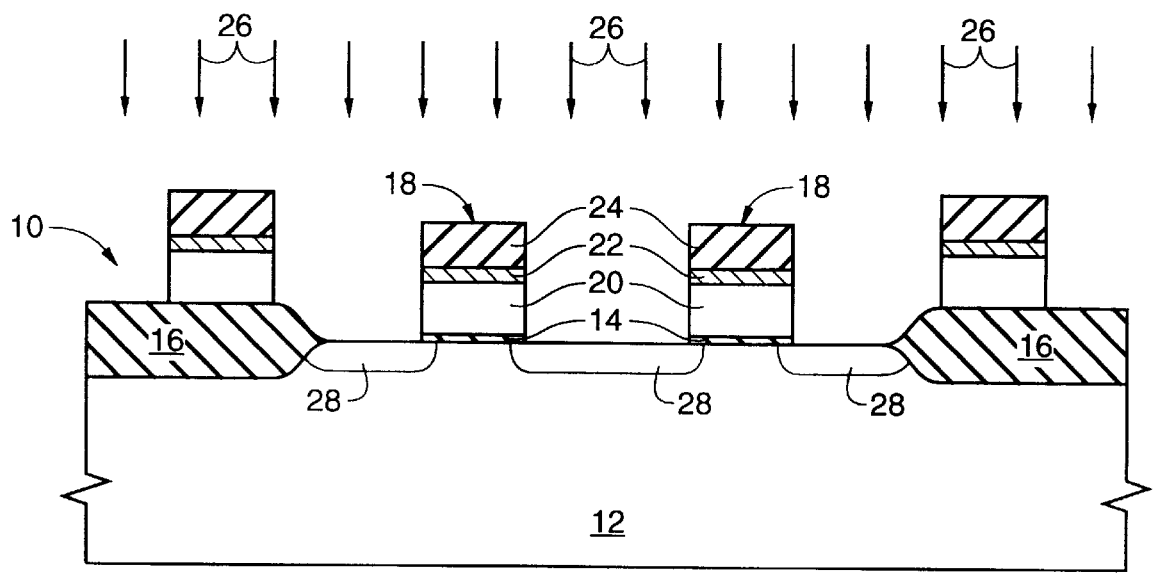
FIGS. 1–8 are cross section views of a container type stacked capacitor DRAM memory cell at various stages of formation illustrating one embodiment of the invention.

Reference will now be made to FIGS. 1–8, which illustrate a process for forming a container type stacked capacitor DRAM memory cell. Referring to FIG. 1, wafer 10 comprises a lightly doped p-type single crystal silicon substrate 12 which has been oxidized to form thin gate insulating layer 14 and thick field oxide regions 16. Field oxide regions 16 provide electrical isolation between the memory cell array and the periphery as well as between individual memory cells within the array. Field oxide regions 16 are formed by conventional methods well known in the art, such as forming an apertured layer of silicon nitride (not shown) or other non-oxidizable material on the surface of substrate 12 and thereafter oxidizing the exposed portions of the substrate. Thin gate insulating layer 14 is formed by thermally growing or depositing silicon dioxide on the surface of substrate 12.

Transistor gate electrodes 18 are formed by successively depositing or "stacking" layers of polysilicon 20, tungsten silicide 22 and silicon dioxide 24 over thin gate insulating layer 14, and then patterning and etching those layers to expose substrate 12 at the desired locations of the source and drain for the access transistors. These layers are deposited, patterned and etched using conventional methods well known in the art. Alternatively, transistor gate electrodes 18 may be formed of a single layer of polysilicon deposited and etched as describe above. The tungsten silicide and silicon dioxide layers are included herein simply to better illustrate the details of one of the preferred embodiments of the invention.

P-type impurities, typically boron atoms, are then implanted into the exposed portions of substrate 12, as shown symbolically by arrows 26. Boron ions are implanted at an energy level of approximately of 25–50 KeV, to a depth of approximately 1000 angstroms. The resulting doped p-regions 28 extend into the channel area between the subsequently formed source and drain for each access transistor. The boron implant improves the transistor characteristic by reducing short channel effects such as $V_t$ rollover, sub $V_t$ slope, punch-through and the like.

Figure 2:
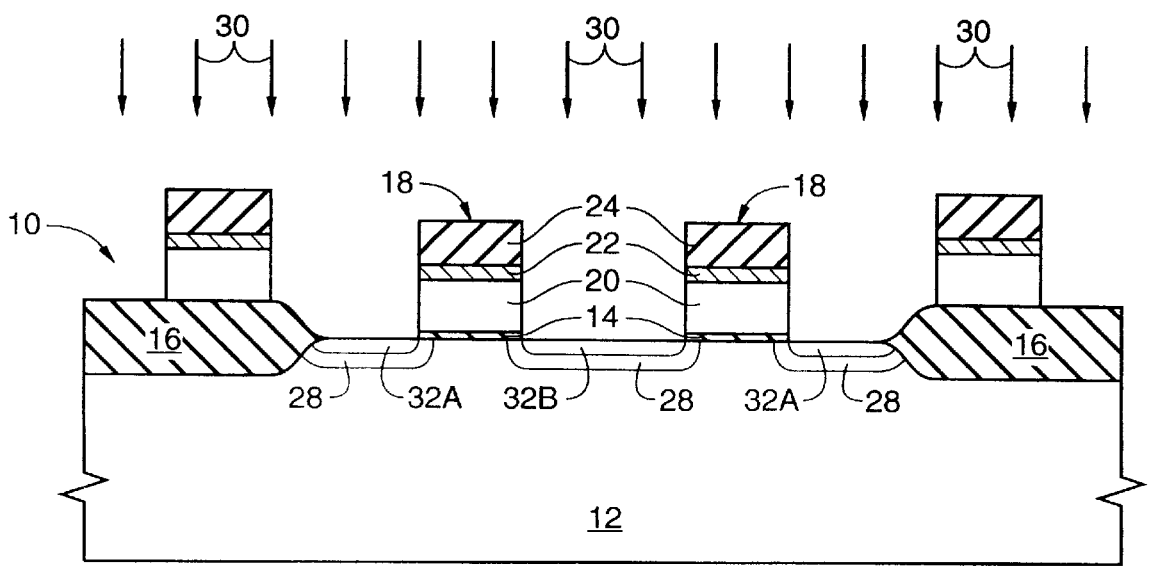

Referring to FIG. 2, lightly doped drain implants (LDDs) are formed by implanting n-type impurities, typically phosphorous or arsenic atoms, in the exposed portions of substrate 12. The implantation of the n-type impurities is shown symbolically by arrows 30. The LDDs form source/drain regions 32a and 32b. The capacitor first conductors 44, shown on FIG. 5, will contact source/drain region 32a. This contact is commonly referred to as the capacitor buried contact.

Figure 8:
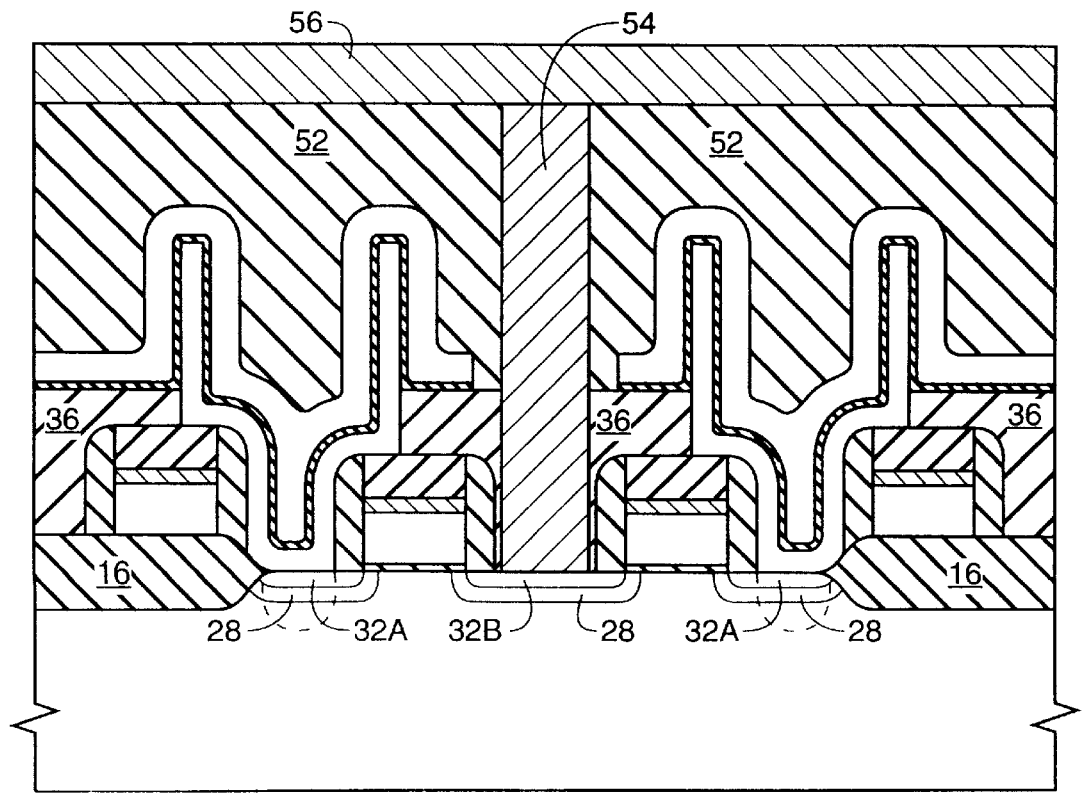

The bit line contact 54, shown on FIG. 8, will contact source/drain region 32b. The LDD dopant is implanted at doses of approximately $1-5 \times 10^{13}$ ions per square centimeter and an implantation energy in the range of 20 to 100 KeV. Implantation at these energy levels results in ion distribution depths of approximately 500–1000 angstroms.

Figure 3:
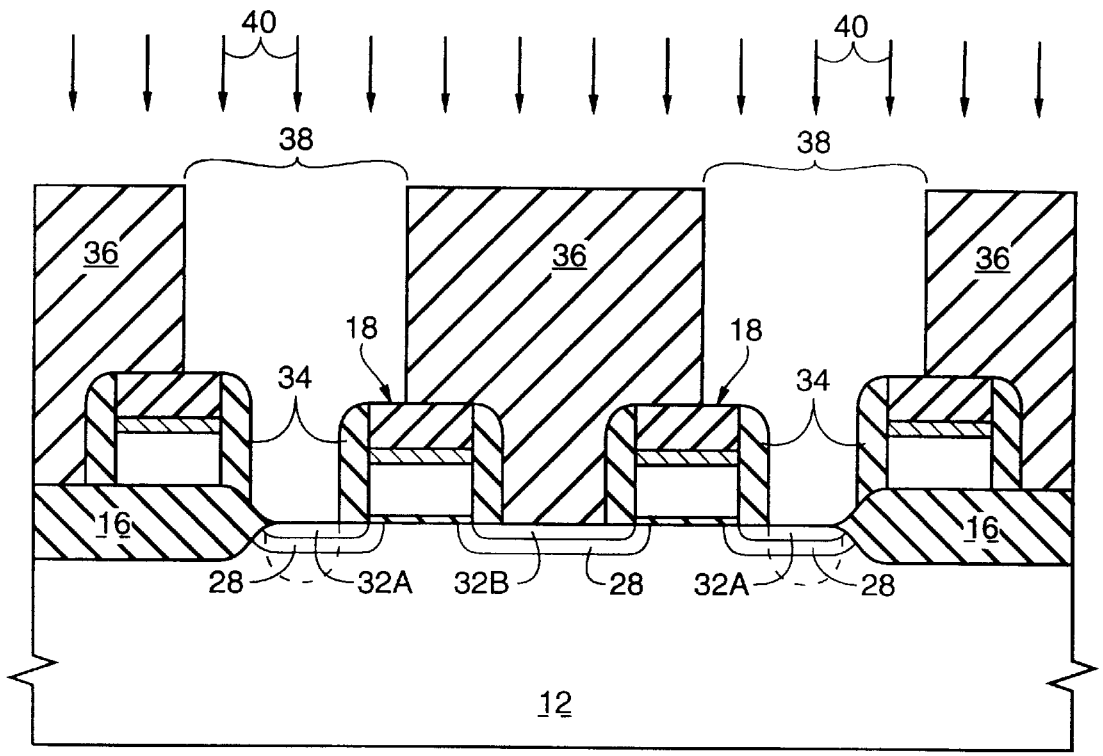

Referring to FIG. 3, insulating spacers 34 are formed on either side of transistor gate electrodes 18. Then, lower insulating layer 36, made of boro-phospho-silicate glass (BPSG), is deposited and, if necessary, planarized. Lower insulating layer 36 is patterned and etched to define capacitor contact corridor 38 (also commonly referred to as the capacitor container) in lower insulating layer 36 and to expose portions of substrate 12 at source/drain region 32a.

N-type impurities, preferably phosphorous atoms, are then implanted into the re-exposed portions of substrate 12, as shown symbolically by arrows 40. Phosphorous ions may be implanted before or after removal of the photoresist used during the patterning and etching of the lower insulating layer 36. Preferably, the phosphorous ions are implanted at doses of approximately $10^{13}$ ions per square centimeter and an implantation energy up to 200 KeV. Implantation at these energy levels results in phosphorous ion distribution depths up to approximately 2,000 angstroms, as shown by the dotted line on FIG. 3. The above and other implant parameters may be varied, as is well known in the art, to optimize the junction profile to cover the boron implant with the phosphorous and to grade the junction as much as possible to reduce the electric field, without adversely affecting performance of the access transistor.

Figure 4:
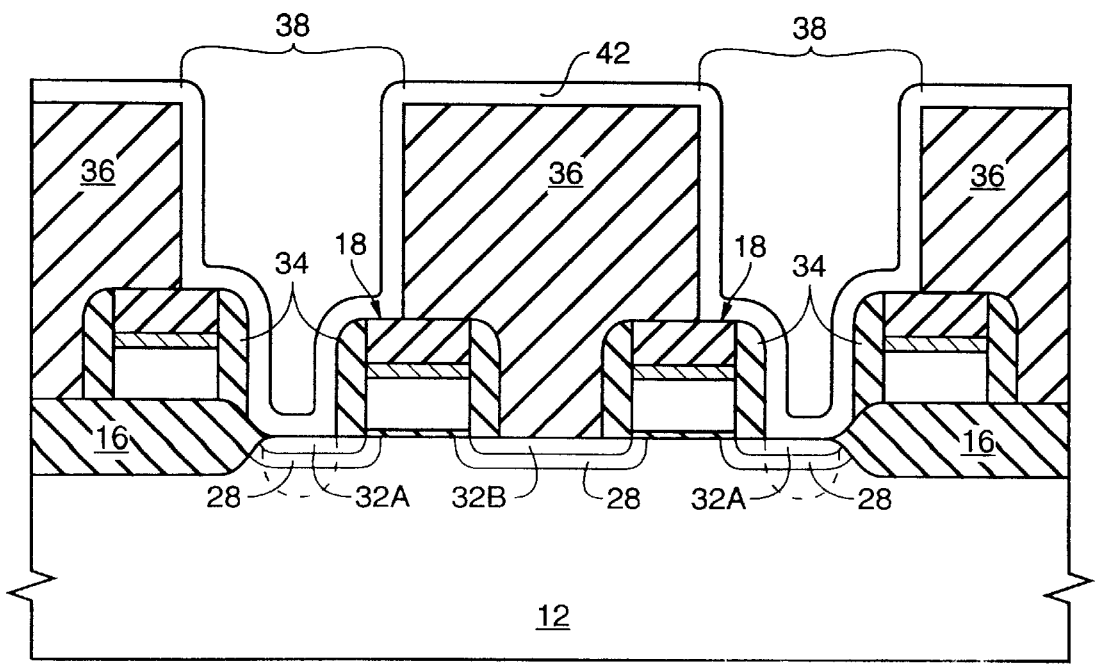

After the phosphorous implant, a second layer of polysilicon 42, also commonly referred to as storage poly or "poly2", is deposited as shown in FIG. 4. Storage poly 42 is doped, preferably rough textured, polysilicon. The storage poly may be doped insitu, by implantation or by diffusion. Storage poly 42 is typically doped insitu with phosphorous. It has been observed that relatively high doping levels for the storage poly, in conjunction with the phosphorous implant described above, will adversely effect refresh and offset the refresh enhancement gained through the phosphorous implant. Therefore, the storage poly doping level should be within the range of $1 \times 10^{19}$ to $1 \times 10^{20}$ atoms per cubic centimeter.

Figure 5:
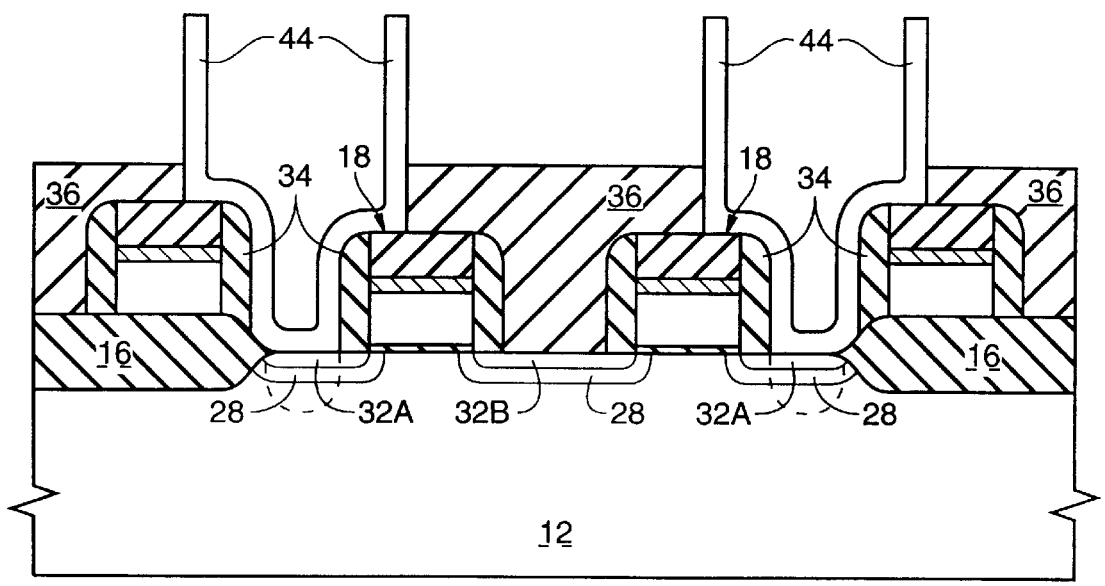

Referring to FIG. 5, storage poly 42 is patterned and etched to form capacitor first conductors 44. This storage poly etch may be followed by a partial oxide etch of lower insulating layer 36 which is selective to polysilicon so as not to etch the exposed storage poly. This oxide etch exposes much of the outer peripheries of capacitor first conductors 44, which significantly increases the capacitance area of the cell.

Figure 6:
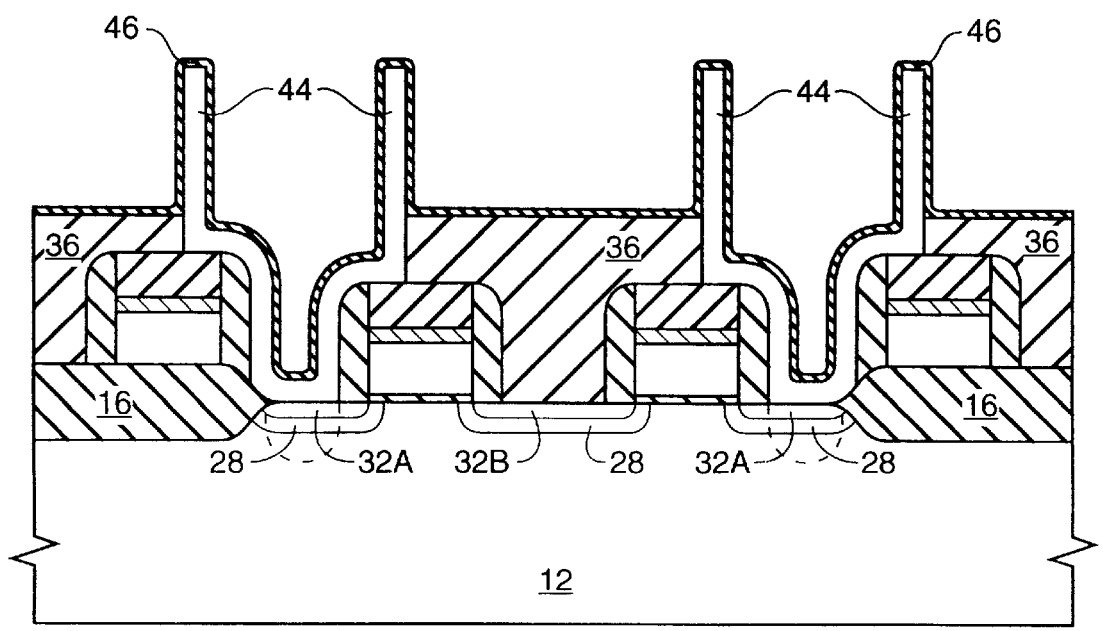

Referring to FIG. 6, capacitor dielectric 46 is deposited. Capacitor dielectric 46 is preferably made of silicon nitride or other materials with high dielectric constants.

Figure 7:
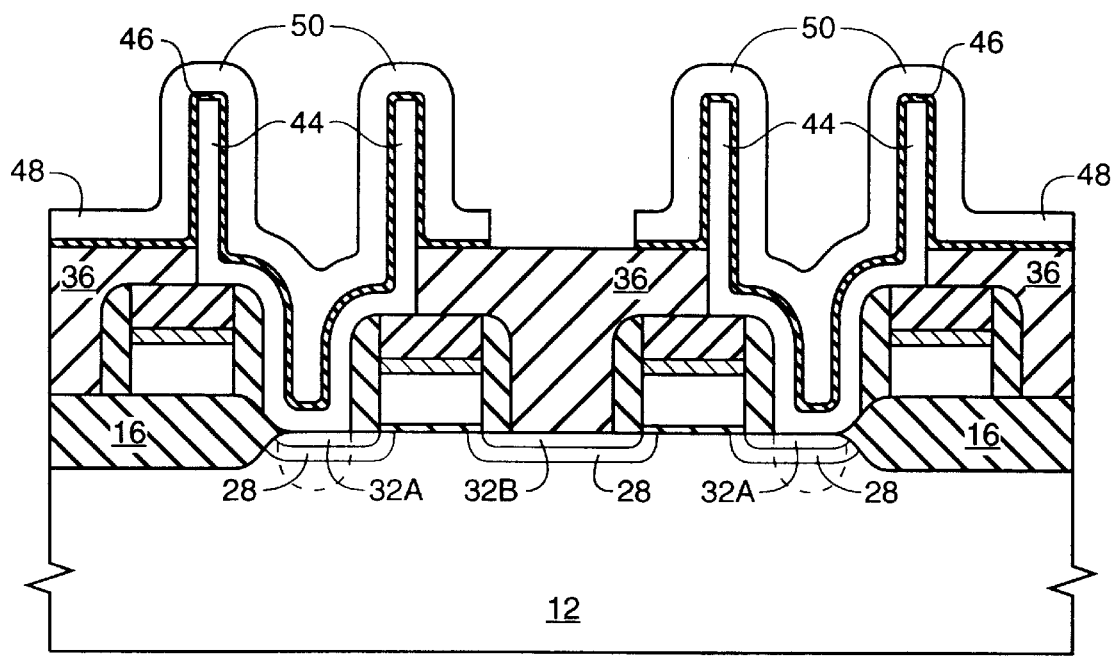

Referring to FIG. 7, a third layer of polysilicon 48, also commonly referred to as the cell poly, is stacked over substrate 12. Cell poly 48 is patterned and etched to form capacitor second conductor 50 and the etch may continue down through capacitor dielectric 46. This cell poly etch is preferably anisotropic, but a timed isotropic etch may also be used.

Referring to FIG. 8, a thick upper insulating layer 52 of BPSG or other suitable insulating material is formed over the exposed upper surfaces of the structure previously formed. Upper insulating layer 52 is patterned and etched to form an opening for bit line contact 54. Upper insulating layer 52 may be planarized using chemical mechanical polish (CMP) or other suitable processes prior to etching. Bit line contact 54 and bit line 56 are formed using metal deposition techniques well known in the art.

In the above and following discussion, some well-known aspects of DRAM fabrication have been simplified. For example, the boron and phosphorous implants typically will by annealed by heating the structure to about 900° C. for about 30 minutes. The particular materials, structures and processes described are intended only to illustrate the invention so that it can be fully understood. Other materials, structures and processes may be substituted for the particular ones described. Silicon nitride may be used for silicon dioxide in some of the insulating layers and spacers. Spin-On Glass (SOG), Polyamide Insulator (PI), Chemical Vapor Deposited (CVD) oxide or other insulators may be used in place of the BPSG. Additional materials, structures and processes may also be added to those disclosed.

An alternative embodiment of the invention will now be described with reference to FIGS. 9–13, which illustrate a process for forming a standard stacked capacitor DRAM memory cell. For convenience, the reference numerals for the various components are the same as those used to describe the container cell illustrated in FIGS. 1–8. In addition, the materials and processes used to form the individual components shown in FIGS. 9–14 are essentially the same as those used for the container cell described above.

Figure 9:
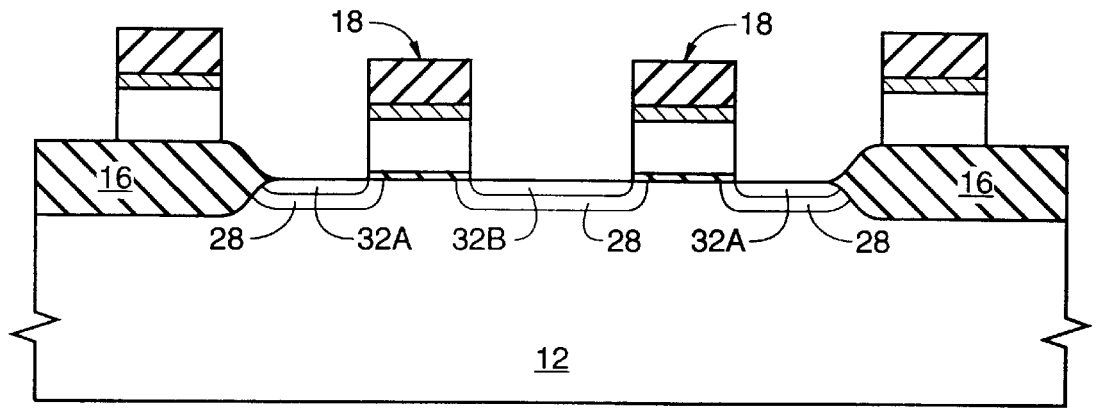
FIGS. 9–14 are cross section views of a portion of a standard stacked capacitor DRAM memory cell at various stages of formation illustrating a second embodiment of the invention.
Figure 10:
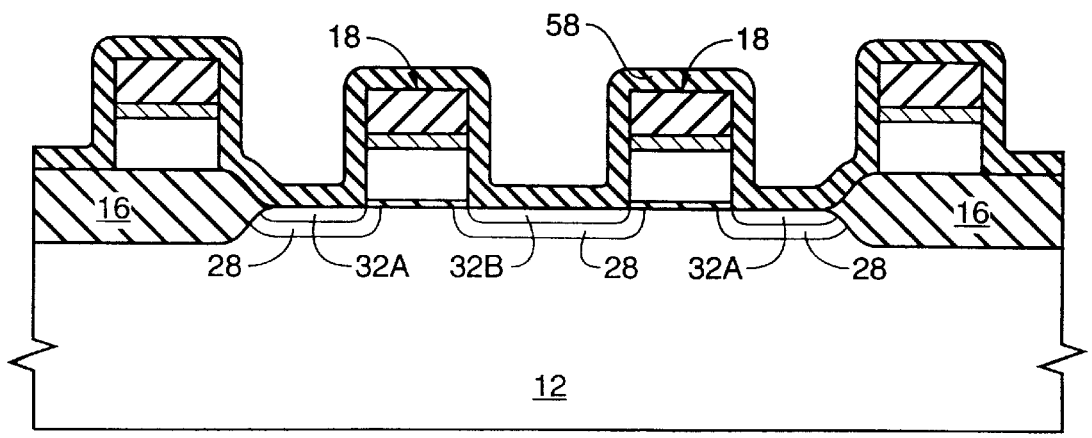
Figure 11:
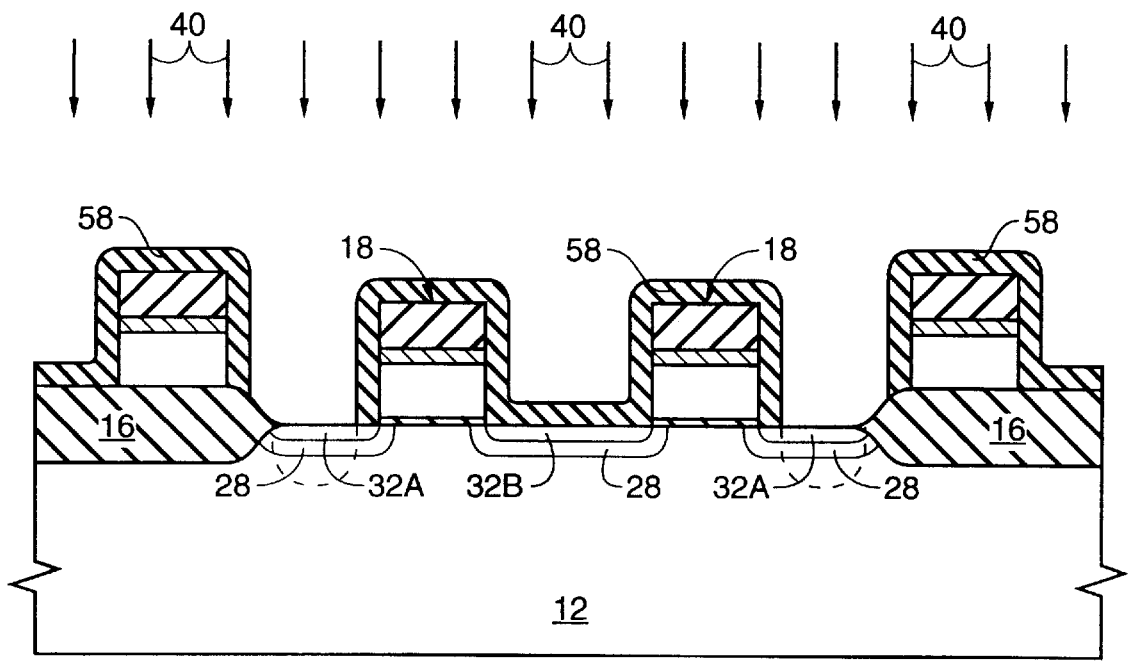

The structure shown in FIG. 9, which illustrates the memory cell after LDD implantation, is formed according to the same process steps described above. Thereafter, and referring to FIG. 10, an insulating layer 58, typically made of silicon dioxide, is stacked over substrate 12. Referring to FIG. 11, insulating layer 58 is patterned and etched, the etch being self aligned to the vertical portion of insulating layer 58, to re-expose substrate 12 at source/drain regions 32a, also commonly referred to as the capacitor buried contact. N-type impurities, preferably phosphorous atoms, are then implanted into the re-exposed portion of substrate 12 at source/drain regions 32a, as shown symbolically by arrows 40. Phosphorous ions are implanted at doses of approximately $10^{13}$ atoms per square centimeter and an implantation energy up to 200 KeV. Implantation at these energy levels results in phosphorous ion distribution depths up to approximately 2,000 angstroms, as shown by the dotted line in FIG. 11.

It has been observed that this phosphorous implant eliminates the severe degradation in refresh that occurs when the capacitor contact corridor is misaligned to the edge of the field oxide region. The phosphorous implant also enhances refresh when there is no misalignment. The mechanism through which refresh is thus enhanced is not known. It has been observed that a substantial number of weak cells are eliminated by the phosphorous implant. It is believed, therefore, that the phosphorous implant eliminates one or more defects in the cell, although the nature of those defect(s) is unknown. There are many possible defects that may be repaired by the phosphorous implant. For example, the elimination of trap assisted tunneling is consistent with the temperature and doping parameters under which refresh is enhanced. The phosphorous implant may place the operating junction in the optimal range, as illustrated in G. A. M.

Hurkx, et al., A New Recombination Model For Device Simulation Including Tunneling, IEEE TRED Vol. 39, No. 2, pp. 331–338 (February 1992) and F. Hurkx, Anomalous Behavior Of Surface Leakage Currents In Heavily Doped Gated Diodes, IEEE TRED Vol. 40, No. 12, pp. 2273–2281 (December 1993), incorporated herein by reference. The phosphorous implant may also deepen the n- junction in the capacitor buried contact covering up any defects in that junction and at the edge of the field oxide.

Figure 12:
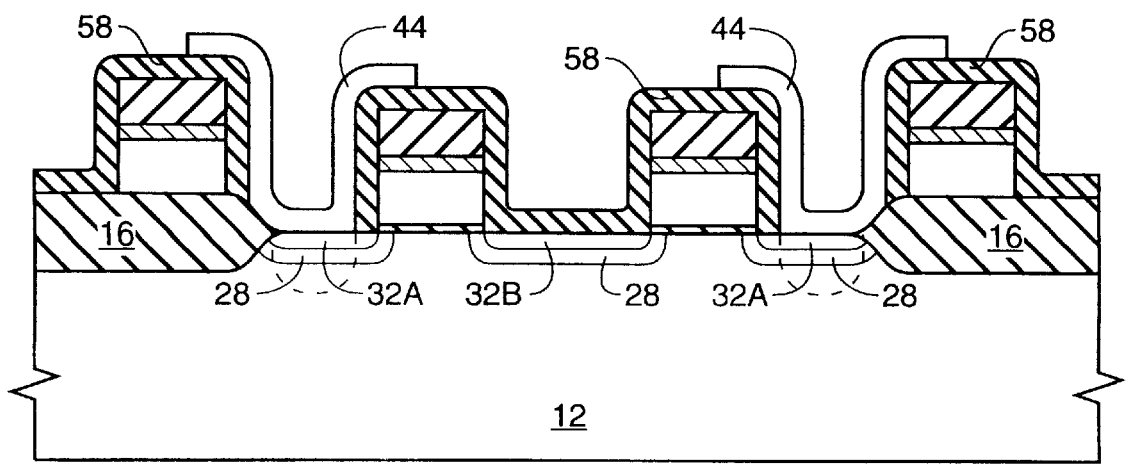

Referring to FIG. 12, storage poly 42 is deposited and patterned and etched to form capacitor first conductor 44.

Figure 13:
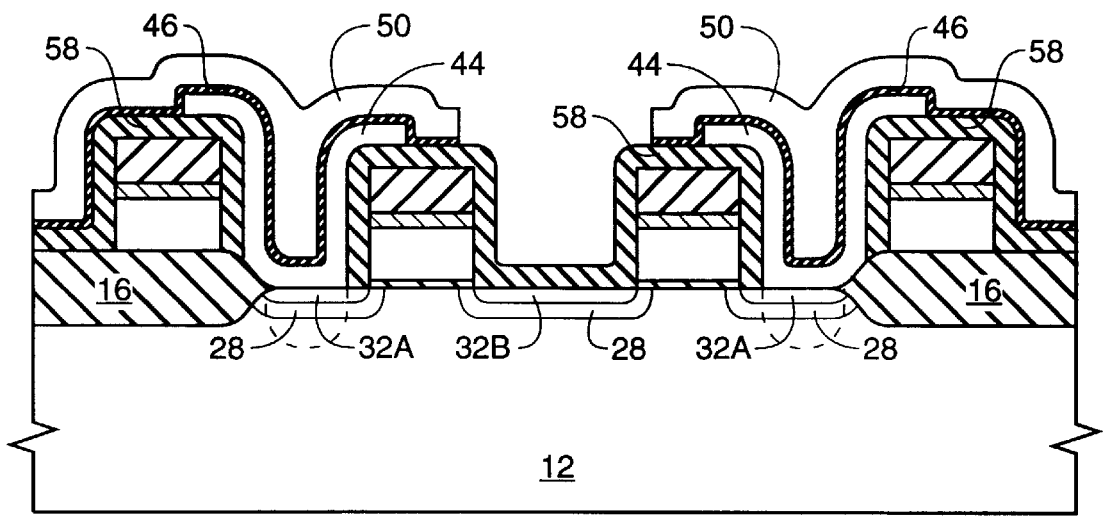

Referring to FIG. 13, capacitor dielectric layer 46 is stacked over substrate 12. Cell poly 48 is then stacked over substrate 12. Cell poly 48 is patterned and etched to form capacitor second conductor 50 and this etch may continue down through dielectric layer 46.

Figure 14:
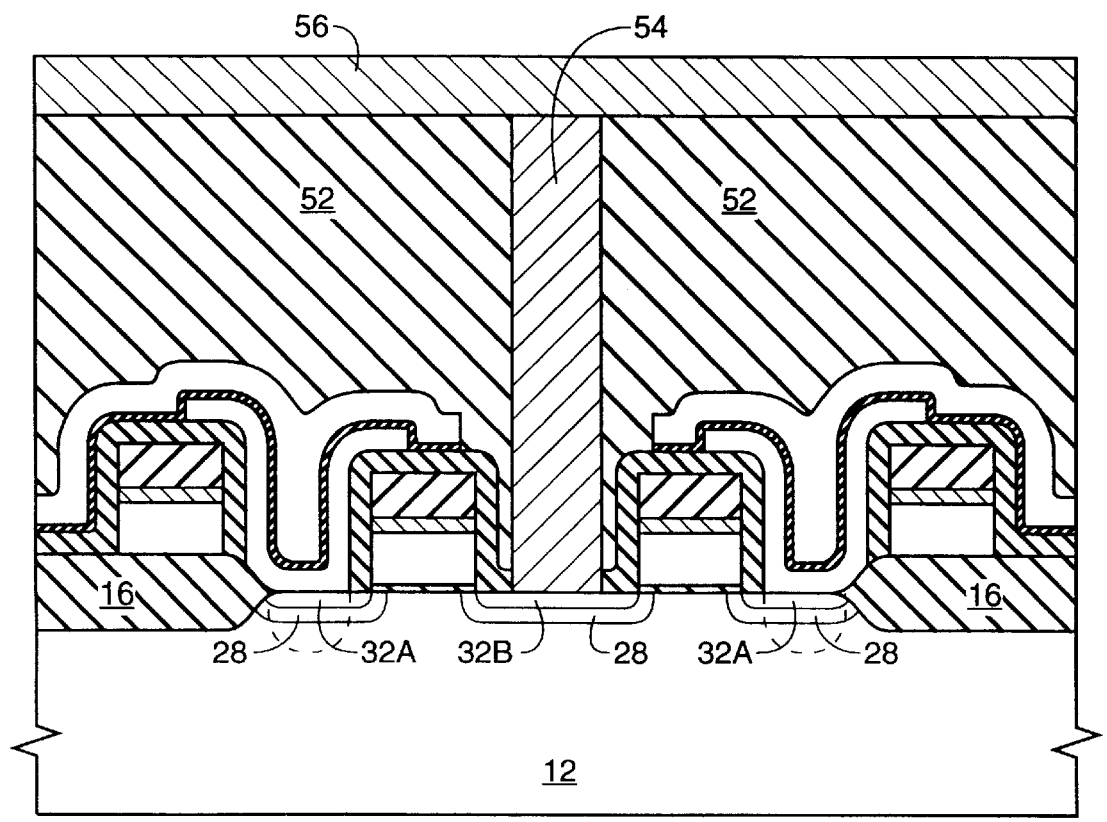

Referring to FIG. 14, upper insulating layer 52 is stacked over substrate 12. Upper insulating layer 52 is then patterned and etched to form an opening for bit line contact 54. Bit line contact 54 and bit line 56 are formed using metal deposition techniques well known in the art.

The particular dimensions of the various layers and components described above can vary widely. The following are the nominal sizes of components in this embodiment, assuming a 4 Mbit DRAM using about a 1.5$\mu m^2$ cell spacing: field oxide regions 16 are about 4000 angstroms thick; thin gate insulating layer 14 is about 125 angstroms thick; storage poly 42 is about 2,000 angstroms thick; cell poly 48 is about 1,000 angstroms thick; capacitor dielectric layer 46 is about 80 angstroms thick; and transistor gate electrodes 18 are about 0.4$\mu$m wide.

There has been shown and described a novel integrated circuit formation process which enhances refresh in DRAM memory cells by, it is believed, eliminating defects in the cells. The particular embodiments shown in the drawings and described herein are for purposes of example and should not be construed to limit the invention as set forth in the appended claims. Those skilled in the art may now make numerous uses and modifications of the specific embodiments described without departing from the scope of the invention. The process steps described may in some instances be performed in a different order and/or equivalent structures and processes may be substituted for the various structures and processes described. A variety of different dimensions and materials may also be used.

We claim:

1. A process for making a semiconductor memory cell, comprising:
   providing a silicon structure having a first conductivity type;
   forming a gate electrode over the silicon structure;
   defining a capacitor contact region in the silicon structure adjacent to one side of the gate electrode and a bit line contact region in the silicon structure adjacent to the other side of the gate electrode;
   performing a first doping operation wherein a second conductivity type dopant opposite the first conductivity type is implanted into the capacitor and bit line contact regions;
   forming an insulating layer over the silicon structure including the capacitor and bit line contact regions;
   selectively removing the insulating layer to expose the capacitor contact region without exposing the bit line contact region and to form a spacer along the sidewall of the gate electrode adjacent to the capacitor contact region; and
   performing a second doping operation wherein a further dosage of a second conductivity type dopant is implanted into the exposed capacitor contact region.

2. A process according to claim 1, wherein the second doping operation follows the first doping operation.

3. A process according to claim 1, wherein the implant in the second doping operation is deeper than the first.

4. A process for making a semiconductor memory cell, comprising:
   providing a silicon structure having a first conductivity type;
   forming a gate electrode over the silicon structure;
   defining a capacitor contact region in the silicon structure adjacent to one side of the gate electrode and a bit line contact region in the silicon structure adjacent to the other side of the gate electrode;
   implanting a second conductivity type dopant opposite the first conductivity type into the capacitor and bit line contact regions, the capacitor and bit line contact regions thereby doped to a first level;
   forming a spacer along a sidewall of the gate electrode adjacent to the capacitor contact region;
   forming an insulating layer over the silicon structure including the capacitor and bit line contact regions;
   selectively removing the insulating layer to expose the capacitor contact region without exposing the bit line contact region and to define a capacitor contact corridor in the insulating layer; and
   implanting a second conductivity type dopant into the exposed capacitor region, the capacitor contact region thereby doped to second level heavier than the first level.

5. A process for making a semiconductor memory cell, comprising:
   providing a silicon structure having a first conductivity type;
   forming a gate electrode over the silicon structure;
   defining a capacitor contact region in the silicon structure adjacent to one side of the gate electrode and a bit line contact region in the silicon structure adjacent to the other side of the gate electrode;
   implanting a phosphorous or arsenic dopant into the capacitor and bit line contact regions, the first and second source/drains regions thereby doped to a first level;
   forming a spacer along the sidewall of the gate electrode adjacent to the capacitor contact region;
   forming an insulating layer over the silicon structure including the capacitor and bit line contact regions;
   selectively removing the insulating layer to expose the capacitor contact region without exposing the bit line contact region and to expose the spacer adjacent to the capacitor contact region; and
   using the spacer as a mask, implanting a phosphorous dopant into the exposed capacitor contact region, the capacitor contact region thereby doped to a second level heavier than the first level.

6. A process for making a semiconductor memory cell, comprising:
   providing a silicon structure having a first conductivity type;
   forming a gate electrode over the silicon structure;
   defining a capacitor contact region in the silicon structure adjacent to one side of the gate electrode and a bit line contact region in the silicon structure adjacent to the other side of the gate electrode;

implanting a second conductivity type dopant opposite the first conductivity type into the capacitor and bit line contact regions, the capacitor and bit line contact regions thereby doped to a first level;

forming an insulating layer over the silicon structure including the capacitor and bit line contact regions;

selectively removing the insulating layer to expose the capacitor contact region without exposing the bit line contact region and to form a spacer along the sidewall of the gate electrode adjacent to the capacitor contact region;

implanting a second conductivity type dopant into the exposed capacitor contact region, the capacitor contact region thereby doped to second level heavier than the first level;

forming a first capacitor conductor in electrical contact with the capacitor contact region;

forming a second capacitor conductor over the first conductor; and forming a dielectric between the first and second conductors.

7. A process for making a semiconductor memory cell array, comprising:

providing a silicon structure having a first conductivity type;

forming a plurality of gate electrodes over the silicon structure;

defining capacitor contact regions in the silicon structure adjacent to one side of the gate electrodes and bit line contact regions in the silicon structure adjacent to the other side of the gate electrodes;

implanting a second conductivity type dopant opposite the first conductivity type into the capacitor and bit line contact regions, the capacitor and bit line contact regions thereby doped to a first level;

forming an insulating layer over the silicon structure including the capacitor and bit line contact regions;

selectively removing the insulating layer to expose the capacitor contact regions without exposing the bit line contact regions and to form spacers along the sidewalls of the gate electrodes adjacent to the capacitor contact regions; and implanting a second conductivity type dopant into the exposed capacitor contact regions, the capacitor contact regions thereby doped to second level heavier than the first level.

8. A process for making a semiconductor memory cell array, comprising:

forming an array of memory cells arranged in rows and columns;

forming a plurality of bit lines, each bit line corresponding to one of the columns of memory cells;

connecting each bit line to the memory cells in the corresponding column of memory cells; and wherein each memory cell is formed by forming a gate electrode over the silicon structure, defining a capacitor contact region in the silicon structure adjacent to one side of the gate electrode and a bit line contact region in the silicon structure adjacent to the other side of the gate electrode;

implanting a second conductivity type dopant opposite the first conductivity type into the capacitor and bit line contact regions, the capacitor and bit line contact regions thereby doped to a first level;

forming an insulating layer over the silicon structure including the capacitor and bit line contact regions;

selectively removing the insulating layer to expose the capacitor contact region without exposing the bit line contact region and to form a spacer along a sidewall of the gate electrode adjacent to the capacitor contact region; and implanting a second conductivity type dopant into the exposed capacitor contact regions, the capacitor contact regions thereby doped to second level heavier than the first level.

* * * * *